(12) United States Patent
Yoshida

(10) Patent No.: US 7,012,792 B2
(45) Date of Patent: Mar. 14, 2006

(54) SEMICONDUCTOR INTEGRATED CIRCUIT

(75) Inventor: Mitsuru Yoshida, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 341 days.

(21) Appl. No.: 10/326,527

(22) Filed: Dec. 19, 2002

(65) Prior Publication Data

US 2003/0117758 A1    Jun. 26, 2003

(30) Foreign Application Priority Data

Dec. 26, 2001  (JP) ............................. 2001-395360

(51) Int. Cl.
*H02H 9/08*   (2006.01)
(52) U.S. Cl. ...................... 361/57; 361/93.9
(58) Field of Classification Search ............. 361/79, 361/86, 87, 89, 93.7, 93.8, 93.9, 57; 327/309, 327/322
See application file for complete search history.

(56) References Cited

U.S. PATENT DOCUMENTS

| | | | |
|---|---|---|---|
| 4,551,779 A * | 11/1985 | Murakami et al. ............. 361/86 |
| 4,893,158 A | 1/1990 | Mihara et al. | |
| 5,444,591 A * | 8/1995 | Chokhawala et al. .......... 361/18 |
| 5,621,601 A * | 4/1997 | Fujihira et al. ............. 361/93.9 |
| 5,724,218 A * | 3/1998 | Tihanyi ........................ 361/79 |
| 6,538,480 B1 * | 3/2003 | Takada et al. ............... 327/108 |

FOREIGN PATENT DOCUMENTS

| | | |
|---|---|---|
| DE | 3821 065 | 1/1989 |
| JP | 1-282858 | 11/1989 |

* cited by examiner

*Primary Examiner*—Brian Sircus
*Assistant Examiner*—Danny Nguyen
(74) *Attorney, Agent, or Firm*—Muirhead and Saturnelli, LLC

(57) ABSTRACT

A semiconductor integrated circuit of the present invention has an output field-effect transistor formed on a main surface of a semiconductor substrate; an overcurrent detection circuit detecting an overcurrent of the output field-effect transistor; and an overcurrent limiting circuit which is connected between the gate electrode terminal and the source electrode terminal of the output field-effect transistor, controls the detected current of the overcurrent detection circuit and varies its output voltage according to variation in threshold voltage of the output field-effect transistor.

8 Claims, 4 Drawing Sheets

SEMICONDUCTOR INTEGRATED CIRCUIT

BACKGROUND OF THE INVENTION

1. Field of the Invention

The present invention relates to a semiconductor integrated circuit. More specifically, the present invention relates to a semiconductor integrated circuit including an overcurrent limiting circuit which varies its output voltage according to variation in threshold voltage of an output MOS transistor.

2. Description of the Prior Art

As a prior art semiconductor integrated circuit including an overcurrent limiting circuit, there are known a first overcurrent limiting circuit in which a gate-source voltage of an output MOS transistor is connected to a Zener diode for control by a Zener voltage and a second overcurrent limiting circuit in which a gate-source voltage is connected to several diodes for control by a forward voltage.

Such semiconductor integrated circuit including an overcurrent limiting circuit is disclosed in Japanese Published Unexamined Patent Application No. Hei 06-091262. FIG. 4 is a circuit diagram of a semiconductor integrated circuit including an overcurrent limiting circuit disclosed in Japanese Published Unexamined Patent Application No. Hei 06-091262.

Referring to FIG. 4, a prior art semiconductor integrated circuit 400 including an overcurrent limiting circuit outputs a constant voltage by a Zener voltage or a forward voltage of diodes (D1, D2 and D3) irrespective of the threshold value of an output MOS transistor (M41).

The operation of the circuit will be described. In the prior art semiconductor integrated circuit 400 including an overcurrent limiting circuit, when the output MOS transistor (M41) is brought to an overcurrent state, the drain voltage of the output MOS transistor (M41) rises so that a second MOS transistor (M42) is brought to the on state. The gate-source voltage of the output MOS transistor (M41) is limited by a forward voltage of the three-stage diodes (D1 to D3). The output current of the output MOS transistor (M41) is limited.

In the prior art semiconductor integrated circuit including an overcurrent limiting circuit, the electric current of the output MOS transistor M41 is varied.

The largest variation cause of the current limiting value of the output MOS transistor M41 is variation in threshold voltage of the output MOS transistor M41. When the performance of the output MOS transistor becomes good, the variation is increased.

In the prior art semiconductor integrated circuit including an overcurrent limiting circuit, when the threshold voltage of the output MOS transistor is varied, the output voltage of a constant voltage circuit is not changed. The current limiting value is largely varied.

BRIEF SUMMARY OF THE INVENTION

SUMMARY OF THE INVENTION

A semiconductor integrated circuit of the present invention has an output field-effect transistor formed on a main surface of a semiconductor substrate; an overcurrent detection circuit detecting an overcurrent of the output field-effect transistor; and an overcurrent limiting circuit which is connected between the gate electrode terminal and the source electrode terminal of the output field-effect transistor, controls the detected current of the overcurrent detection circuit and varies its output voltage according to variation in threshold voltage of the output field-effect transistor.

BRIEF DESCRIPTION OF THE DRAWINGS

The above-mentioned and other objects, features and advantages of this invention will become more apparent by reference to the following detailed description of the invention taken in conjunction with the accompanying drawings, wherein.

DETAILED DESCRIPTION OF THE INVENTION

Figure 1:
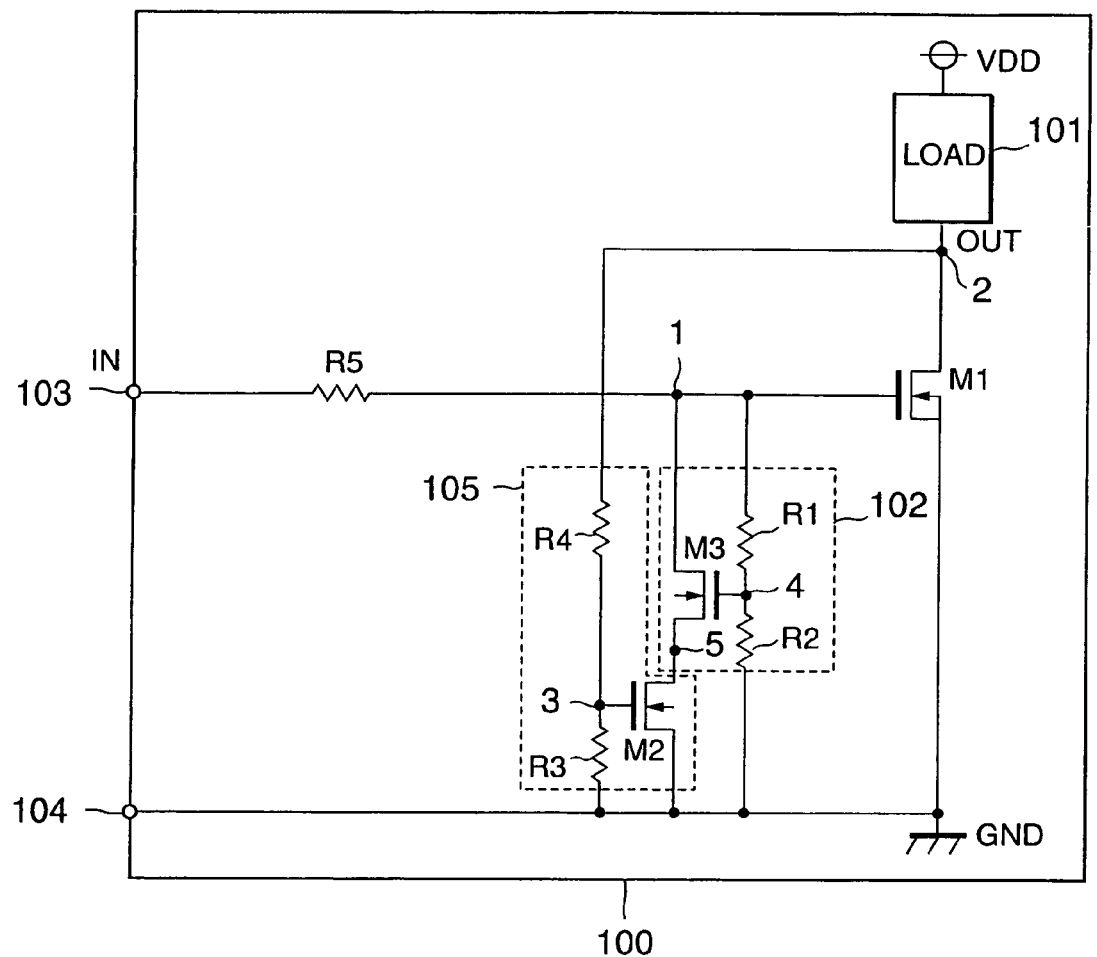
FIG. 1 is a block diagram of a semiconductor integrated circuit of a first embodiment of the present invention.

An embodiment of the present invention will be described with reference to the drawings. FIG. 1 is a block diagram of a semiconductor integrated circuit of a first embodiment of the present invention.

Referring to FIG. 1, a semiconductor integrated circuit 100 of the first embodiment of the present invention has an N channel output MOS transistor (M1) formed on a silicon substrate; an overcurrent detection circuit 105 detecting an overcurrent of the N channel output MOS transistor (M1); and an overcurrent limiting circuit 102 which is connected between the gate electrode terminal and the source electrode terminal of the N channel output MOS transistor (M1), controls the detected current of the overcurrent detection circuit 105, and varies its output voltage according to variation in threshold voltage of the N channel output MOS transistor (M1).

The overcurrent detection circuit 105 of the semiconductor integrated circuit 100 of the first embodiment of the present invention has third and fourth resistors (R3, R4) connected in series to detect the voltage between the drain terminal and the source terminal of the output transistor (M1), and a transistor (M2) detecting an overcurrent having its gate electrode connected to the junction of the third and fourth resistors.

The overcurrent limiting circuit 102 of the semiconductor integrated circuit 100 of the first embodiment of the present invention has first and second resistors (R1, R2) deciding a gate voltage of the output transistor (M1) so as to limit the overcurrent of the overcurrent detection circuit 105, and a transistor (M3) having a diffusion layer formed by the same step as that of a base diffusion layer deciding a threshold voltage of the output MOS transistor (M1).

The overcurrent limiting circuit 102 has the first and second resistors connected in series to be connected between the gate electrode terminal and the source electrode terminal of the output MOS transistor (M1), and the third N channel MOS transistor (M3) having its gate electrode connected to the junction of the first and second resistors so as to be cascade connected to the second N channel MOS transistor (M2) between the gate electrode terminal and the source electrode terminal of the output MOS transistor.

In the above construction, a constant voltage VGS of a node 4 produced in the semiconductor integrated circuit 100 is expressed by the following equation using a threshold value VTM3 of the third N channel MOS transistor (M3), and resistor values (r1, r2) of the resistors (R1, R2):

$$VGS = (1 + r1/r2)\, VTM3 \qquad (1)$$

As shown in the equation (1), the threshold voltage of the transistor (M3) is varied with the threshold voltage of the output transistor (M1) to reduce variation in the current limiting value.

In summary, the semiconductor integrated circuit 100 of the present invention has the overcurrent limiting circuit 102 outputting a constant voltage varied with a threshold value (VTM1) of the output MOS transistor M1. The overcurrent limiting circuit has the third MOS transistor (M3) which varies its threshold value with the output MOS transistor and the resistors (R1, R2).

The operation of the semiconductor integrated circuit of the first embodiment of the present invention will be described.

In the semiconductor integrated circuit 100 of the first embodiment of the present invention, when the output MOS transistor (M1) is brought to an overcurrent state, the drain voltage of the output MOS transistor (M1) rises so that the second transistor (M2) is brought to the on state.

The gate-source voltage of the output MOS transistor (M1) is limited by the overcurrent limiting circuit 102 as the constant voltage circuit having the third MOS transistor (M3) and the resistors (R1, R2). The output overcurrent of the output MOS transistor (M1) is limited.

In the operation of the third MOS transistor (M1), its threshold voltage is varied with the threshold voltage of the output MOS transistor since it has the diffusion layer formed by the same step as that of the base diffusion layer deciding a threshold voltage of the output MOS transistor.

Figure 2:
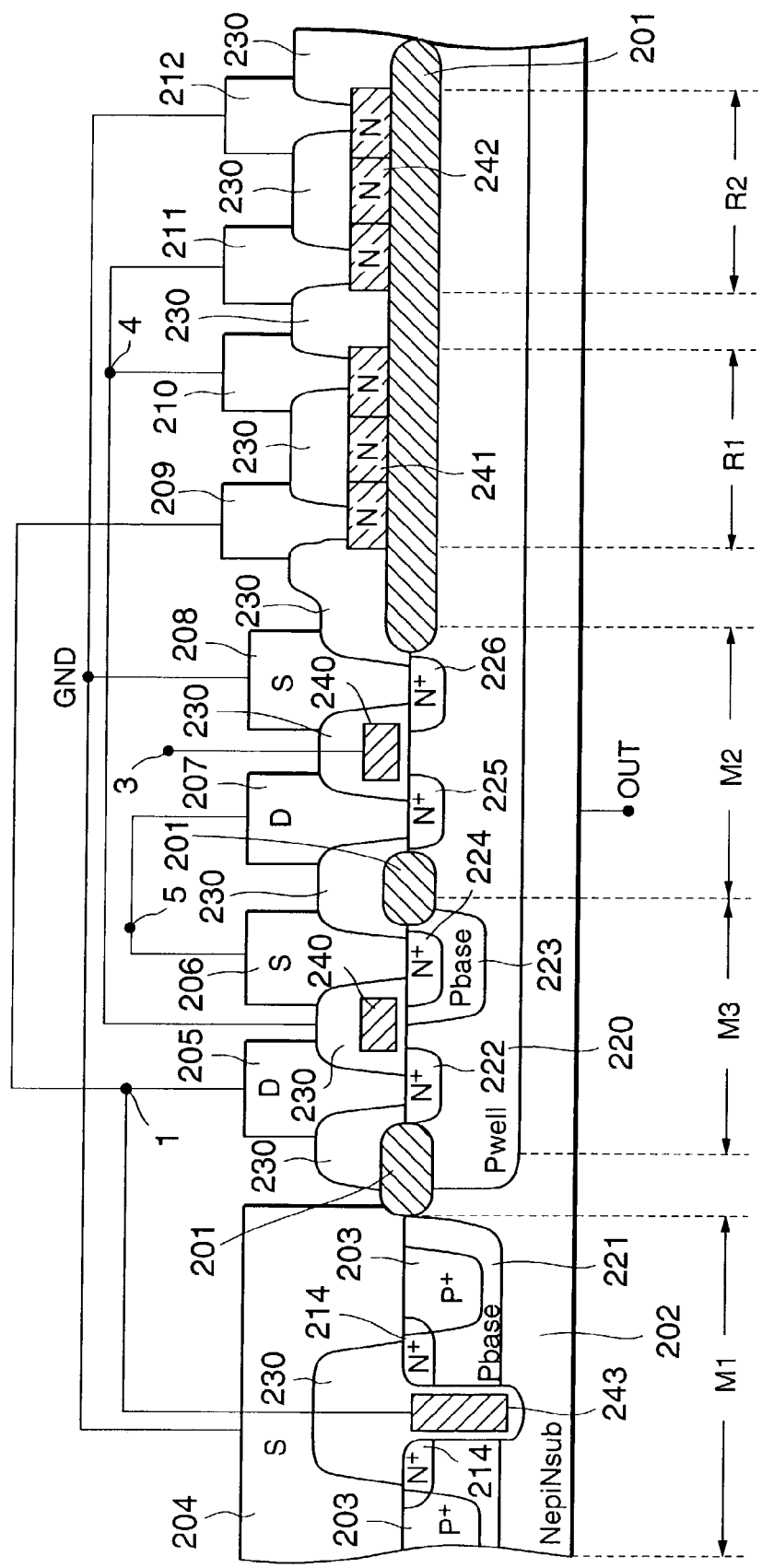
FIG. 2 is a sectional construction diagram of a semiconductor substrate of the semiconductor integrated circuit of the first embodiment of the present invention.

FIG. 2 is a schematic sectional construction diagram of the semiconductor integrated circuit on a semiconductor substrate of the first embodiment of the present invention.

The semiconductor integrated circuit 100 of the first embodiment of the present invention is formed on a silicon substrate 202. The output MOS transistor M1 has a gate electrode 243, a drain region 202 and a source region 214. A base diffusion layer (Pbase) 221 deciding a threshold voltage of the output MOS transistor M1 is formed.

The third MOS transistor (M3) is formed in a P-well region 220. The third MOS transistor (M3) has a gate layer 240 formed by a polysilicon layer, a drain region 222 and a source region 224. The source region 224 is formed with a base diffusion layer (Pbase) 223. The third MOS transistor (M3) is formed with a drain electrode 205 and a source electrode 206.

The base diffusion layers (221, 223) are formed by ion implanting boron having a dose of 3.4E13, as an example of an impurity.

The threshold values of the transistors M1 and M3 are about 1.8V.

Figure 3:
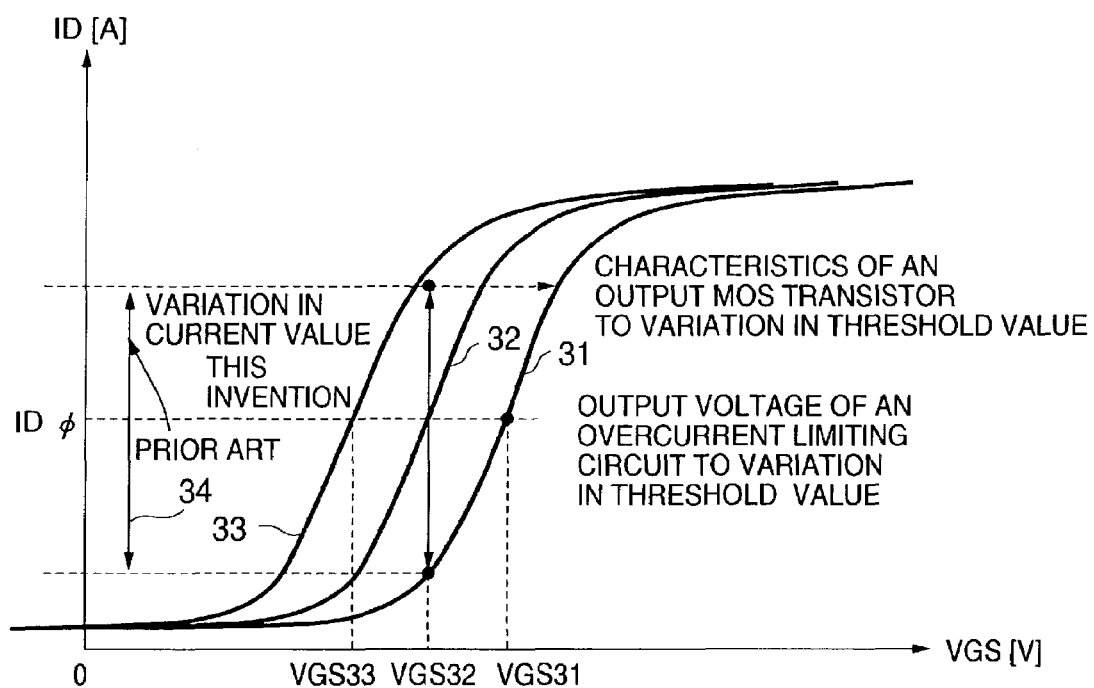
FIG. 3 is a diagram showing the characteristics of the semiconductor integrated circuit of the first embodiment of the present invention and an output current waveform chart of the semiconductor integrated circuit of the embodiment of the present invention.
Figure 4:
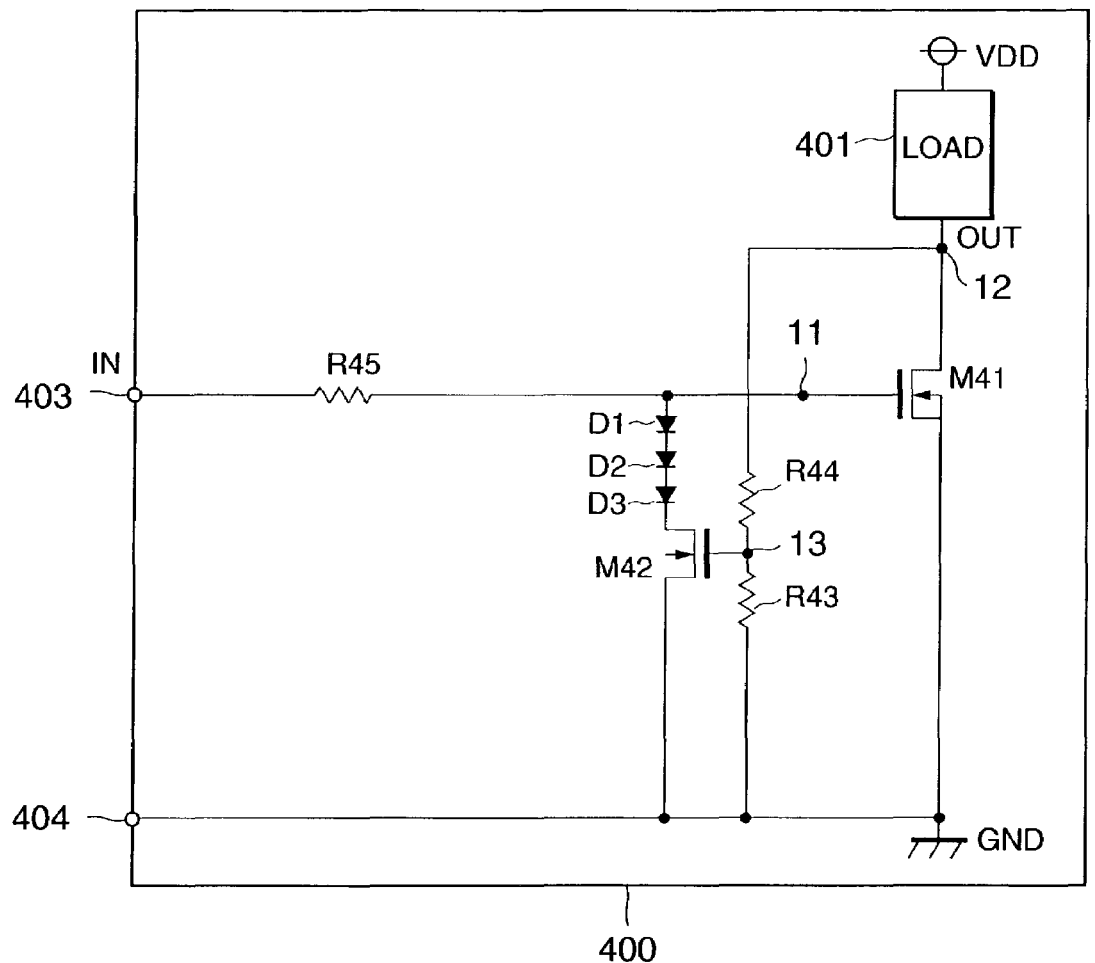
FIG. 4 is a block diagram of a prior art semiconductor integrated circuit.

FIG. 3 is a diagram showing the characteristics of the semiconductor integrated circuit of the first embodiment of the present invention and an output current waveform chart of the semiconductor integrated circuit of the embodiment of the present invention.

As shown in FIG. 3, the characteristics of the output MOS transistor M1 to variation in the threshold value are indicated by solid lines 31, 32 and 33. The threshold value of the third MOS transistor is varied with the threshold voltage of the output MOS transistor. When the gate voltage of the output MOS transistor M1 is varied to be VGS31, VGS32 and VGS 33, its output current ID0 is hardly varied.

As described above, the semiconductor integrated circuit of the present invention has the overcurrent detection circuit 105 detecting an overcurrent of the N channel output MOS transistor (M1) ;and the overcurrent limiting circuit 102 which is connected between the gate electrode terminal and the source electrode terminal of the N channel output MOS transistor (M1), controls the detected current of the overcurrent detection circuit 105, and varies its output voltage according to variation in threshold voltage of the N channel output MOS transistor (M1). The current limiting circuit outputting a constant voltage varied with the threshold value of the output MOS transistor is constructed to reduce variation in the current limiting value.

Although the invention has been described with reference to specific embodiments, this description is not meant to be construed in a limiting sense. Various modifications of the disclosed embodiments will become apparent to persons skilled in the art upon reference to the description of the invention. It is therefore contemplated that the appended claims will cover any modifications or embodiments as fall within the true scope of the invention.

What is claimed is:

1. A semiconductor integrated circuit, comprising:
an output field-effect transistor formed on a main surface of a semiconductor substrate;
an overcurrent detection circuit detecting an overcurrent of said output field-effect transistor and including a second field-effect transistor; and
an overcurrent limiting circuit connected between a gate electrode terminal and a source electrode terminal of said output field-effect transistor, wherein said overcurrent limiting circuit is controlled by the detected current of said overcurrent detection circuit, wherein an output voltage of said overcurrent limiting circuit is varied according to variation in a threshold voltage of said output field-effect transistor, and wherein said overcurrent limiting circuit includes a third field-effect transistor connected to said second-field effect transistor of the overcurrent detection circuit, a source region of said third field-effect transistor being surrounded by a diffusion layer with substantially the same characteristics as that of a base diffusion layer deciding the threshold voltage of said output field-effect transistor.

2. The semiconductor integrated circuit according to claim 1, wherein said overcurrent detection circuit has third and fourth resistors connected in series detecting an overcurrent of said output field-effect transistor and said second field-effect transistor having a gate electrode connected to the junction of said third and fourth resistors.

3. The semiconductor integrated circuit according to claim 2, wherein said overcurrent limiting circuit has first and second resistors connected in series to be connected between the gate electrode terminal and the source electrode terminal of said output field-effect transistor, and wherein said third field-effect transistor has a gate electrode connected to the junction of said first and second resistors so as to be cascade connected to said second field-effect transistor between the gate electrode terminal and the source electrode terminal of said output field-effect transistor.

4. The semiconductor integrated circuit according to claim 3, wherein said output field-effect transistor, said second field-effect transistor and said third field-effect transistor are formed by a field-effect transistor of the same conductive type.

5. A method for controlling a semiconductor integrated circuit, comprising:
fanning an output field-effect transistor on a semiconductor substrate;
detecting an overcurrent of said output field-effect transistor;
connecting an overcurrent limiting circuit to a gate electrode terminal and a source electrode terminal of said output field-effect transistor; and
varying an output voltage of said overcurrent limiting circuit according to a variation in a threshold voltage of said output field-effect transistor, wherein said overcurrent limiting circuit includes an additional field-effect transistor having a source region adjacent to a diffusion layer with substantially the same characteristics as that of a base diffusion layer deciding the threshold voltage of said output field-effect transistor.

6. The method according to claim 5, wherein detecting of the overcurrent of the output field-effect transistor is performed by an overcurrent detection circuit having two resistors connected in series and a detection field-effect transistor having a gate electrode connected to the junction of said resistors.

7. The method according to claim 5, wherein said overcurrent limiting circuit includes two resistors connected in series and connected between the gate electrode terminal and the source electrode terminal of said output field-effect transistor, and wherein said additional field-effect transistor has a gate electrode connected to the junction of said two resistors so as to be cascade connected to the detection field-effect transistor between the gate electrode terminal and the source electrode terminal of said output field-effect transistor.

8. The semiconductor integrated circuit according to claim 3, wherein said output field-effect transistor, said detection field-effect transistor and said additional field-effect transistor are of the same conductive type.

* * * * *